United States Patent [19]
Ko et al.

[11] Patent Number: 5,795,802
[45] Date of Patent: Aug. 18, 1998

[54] METHOD FOR MANUFACTURING SEMICONDUCTOR DEVICE

[75] Inventors: Sang-Gi Ko, Chungcheonbuk-do; Mun-Mo Jeong, Seoul, both of Rep. of Korea

[73] Assignee: LG Semicon Co., Ltd., Chungcheongbuk-Do, Rep. of Korea

[21] Appl. No.: 922,384

[22] Filed: Sep. 3, 1997

[30] Foreign Application Priority Data

Dec. 26, 1996 [KR] Rep. of Korea .................. 72201

[51] Int. Cl.[6] ........................... H01L 21/8238
[52] U.S. Cl. .................. 438/227; 435/225; 435/228; 435/443
[58] Field of Search ................. 438/443, 225, 438/227, 228, 527

[56] References Cited

U.S. PATENT DOCUMENTS

| | | | |
|---|---|---|---|
| 4,462,846 | 7/1984 | Varshney | 148/33.2 |
| 4,710,265 | 12/1987 | Hotta | 438/443 |
| 4,929,565 | 5/1990 | Parrillo | 438/443 |
| 5,024,961 | 6/1991 | Lee et al. | 438/443 |
| 5,455,438 | 10/1995 | Hashimoto et al. | 257/391 |

*Primary Examiner*—Trung Dang
*Attorney, Agent, or Firm*—Morgan, Lewis & Bockius LLP

[57] ABSTRACT

A method for manufacturing a semiconductor device. the method includes the steps of forming an n-type well and a p-type well under a surface of a semiconductor substrate, forming a pad oxide layer having a first thickness on the p-type well and a second thickness on the n-type well, the first thickness being greater than the second thickness, and forming a field oxide layer between the n-type well and the p-type well, the field oxide layer having less bird's beak on the n-type well than on the p-type well.

17 Claims, 10 Drawing Sheets

METHOD FOR MANUFACTURING SEMICONDUCTOR DEVICE

This application claims the benefit of Korean Application No. 72201/1996 filed on Dec. 26, 1996, which is hereby incorporated by reference.

BACKGROUND OF THE INVENTION

1. Field of the Invention

The present invention relates to a method for manufacturing a semiconductor device and, more particularly, to a method for manufacturing a semiconductor device suitable for improving narrow width effects of active regions.

2. Discussion of the Related Art

In general, a complementary metal oxide semiconductor (hereinafter referred to as "CMOS") includes a PMOS with economical power consumption characteristics and an NMOS capable of high speed operations. The NMOS is symmetrical to the PMOS. The process steps for making a CMOS are complicated and its integration is low, but its power consumption is very economical.

Development and research directed to high integration have led to narrower active areas in semiconductor devices. Accordingly, the smaller active areas have led to the greater threshold voltage fluctuation.

Figure 1:
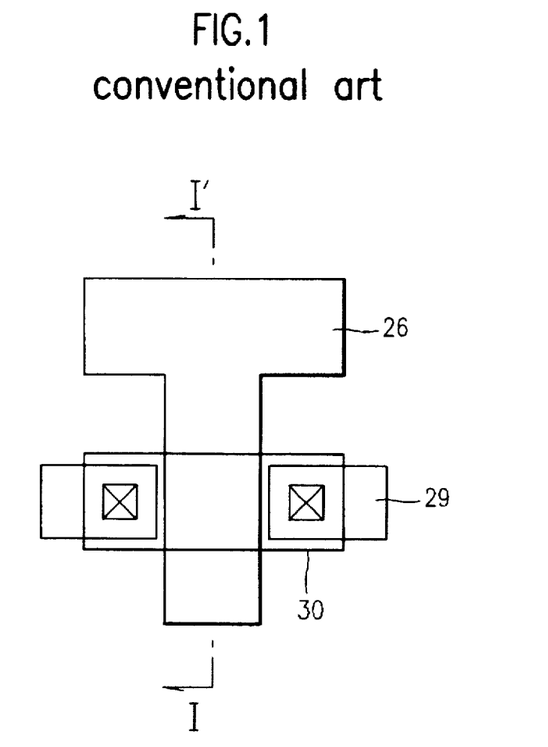
FIG. 1 is a layout of a general transistor.

A conventional method for manufacturing a CMOS is now explained with reference to the accompanying drawings. FIG. 1 is a layout of a general transistor. Referring to FIG. 1, a gate electrode 26 is at a right angle to an active region 30. Impurity regions (not shown) are located in the active region 30 at both sides of the gate electrode 26. Metal wires 29 contact with the impurity regions.

Figure 2A:
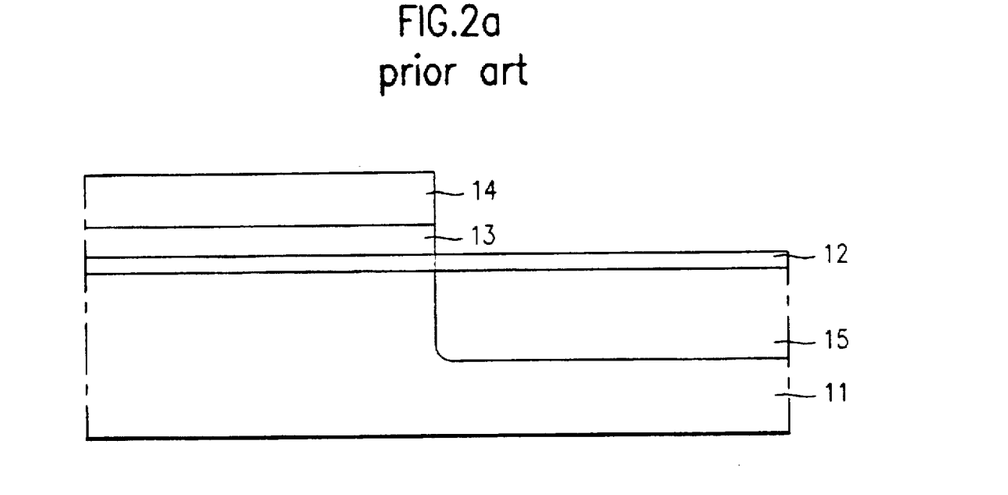
FIGS. 2a–2f are cross-sectional views showing process steps of a conventional method for manufacturing a CMOS.

FIGS. 2a–2f are cross-sectional views showing process steps of a conventional method for manufacturing a CMOS. Referring initially to FIG. 2a, on a p-type semiconductor substrate 11, an early oxide layer 12, a first nitride layer 13, and a first photoresist film 14 are successively formed. Next, the photoresist layer 14 is selectively patterned with exposure and development processes, so that it is removed from a portion of the substrate 11 where an n-type well is to be formed. Subsequently, with the photoresist pattern 14 serving as a mask, the first nitride layer 13 is selectively removed. Thereafter, n-type impurity ions are implanted into the semiconductor substrate 11 and then are diffused with drive-in, thus forming an n-type well 15 under a surface of the semiconductor substrate 11.

Figure 2B:
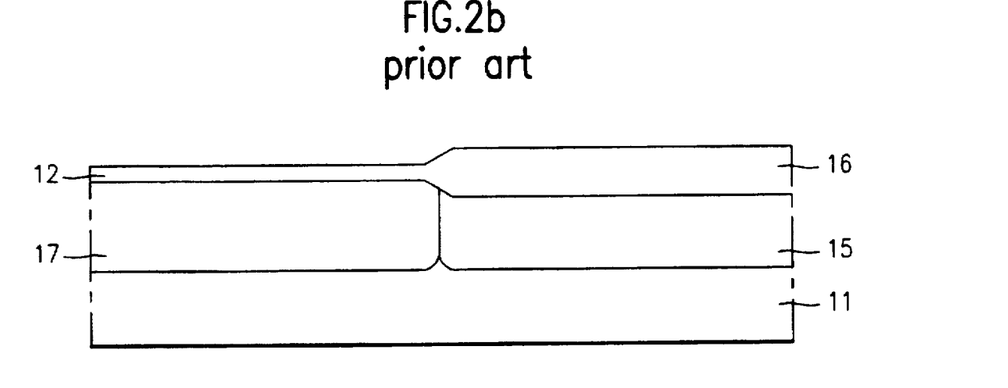

Referring to FIG. 2b, with the nitride layer 13 serving as a mask, a first oxide layer 16 is grown on the surface of the semiconductor substrate 11. Next, the remaining nitride layer 13 is removed. Then, with the first oxide layer 16 serving as a mask, p-type impurity ions are implanted and then diffused with drive-in, thus forming a p-type well 17 next to the n-type well 15, under the surface of the semiconductor substrate 11.

Figure 2C:
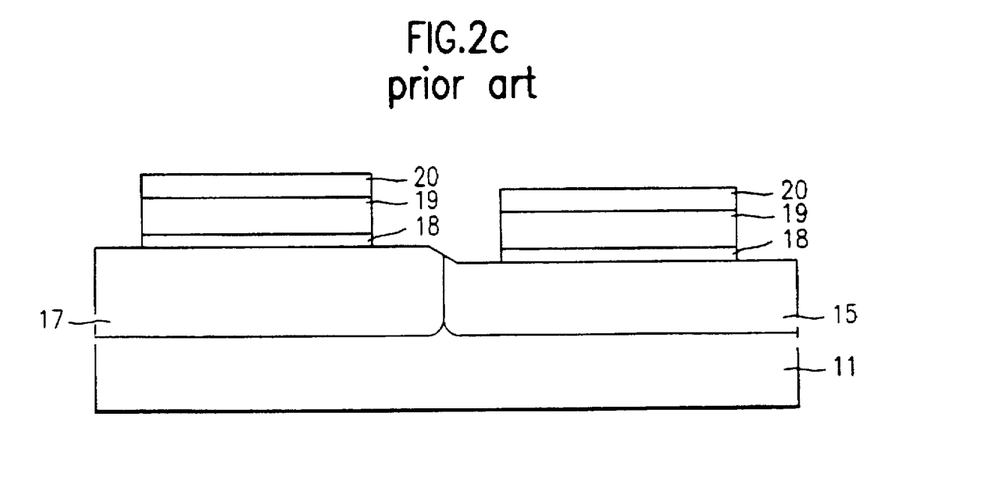

Referring to FIG. 2c, the early oxide layer 12 and the first oxide layer 16 are removed, and then a pad oxide layer 18, a second nitride layer 19, and a second photoresist film 20 are successively formed. Next, the second photoresist film 20 over a device isolation region is selectively removed with exposure and development processes. With the photoresist pattern 20 serving as a mask, the second nitride layer 19 and the pad oxide layer 18 are successively etched.

Figure 2D:
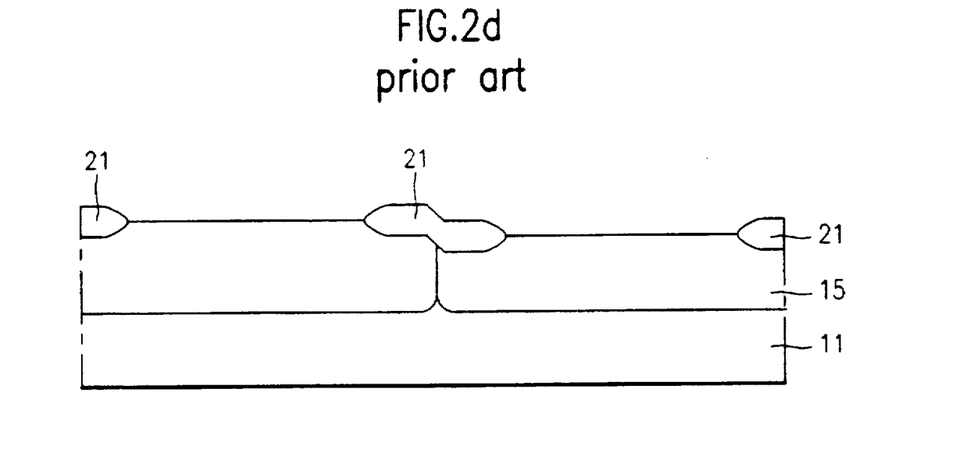

Referring to FIG. 2d, the remaining photoresist film 20 is removed. Next, with the second nitride layer 19 serving as a mask, field ions are implanted to grow a field oxide layer 21 on the device isolation region. Then, the second nitride layer 19 and the pad oxide layer 18 are removed.

Figure 2E:
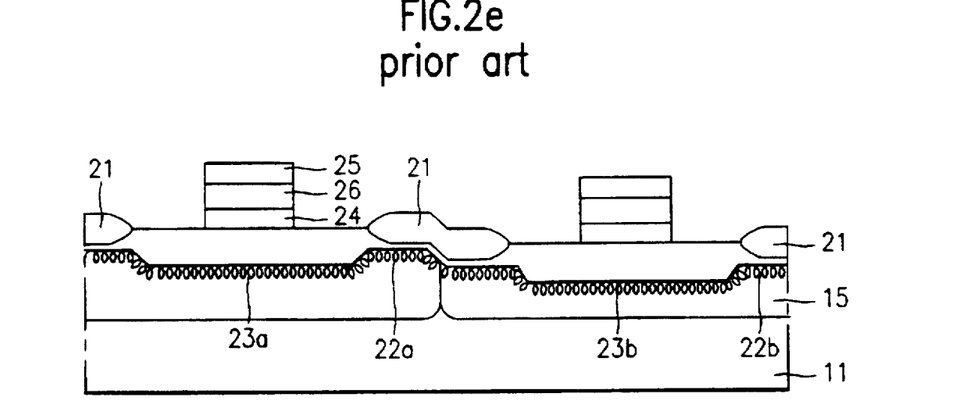

Referring to FIG. 2e, a third photoresist film (not shown) is coated on the entire surface and then is subjected to exposure and development to be left only over the n-type well 15. Then, with the third photoresist pattern serving as a mask, p-type ions are implanted to form a first field stop region 22a and a first punch-through stop region 23a at once. Thereafter, the remaining photoresist film is removed. Subsequently, a fourth photoresist film (not shown) is coated on the entire surface and then is selectively patterned with exposure and development processes to be left only over the p-type well 17. With the fourth photoresist pattern serving as a mask, n-type impurity ions are implanted to form a second field stop region 22b and a second punch-through stop region 23b at once. Then, the remaining fourth photoresist film is removed. Next, a gate oxide layer, a polysilicon layer, and a gate cap oxide layer are successively formed on the p-type well 17, the field oxide layer 21, and the n-type well 15, and then are selectively etched to form a gate electrode 26 including the gate oxide layer 24 and the gate cap oxide layer 25 on the active region between the field oxide layers 21.

Figure 2F:
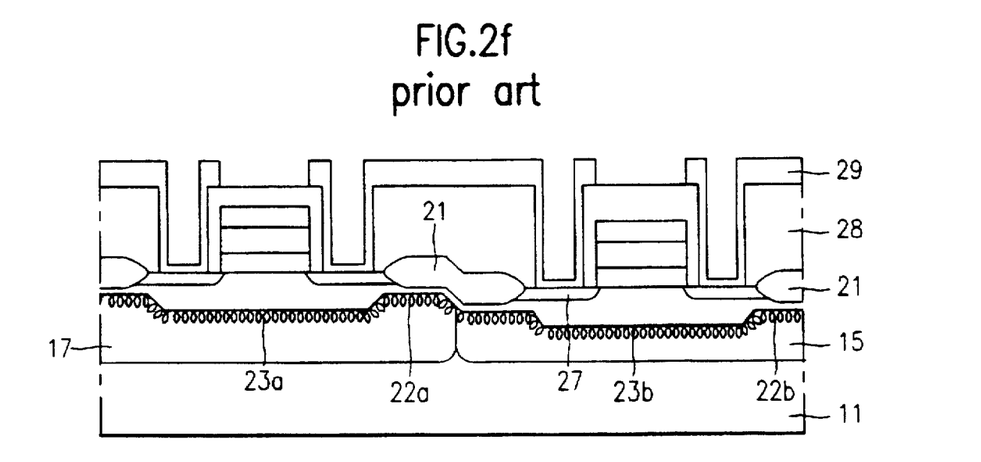

Referring to FIG. 2f, with the gate electrode 26 serving as a mask, p-type impurity ions are implanted into the n-type well 15, and n-type impurity ions are implanted into the p-type well 17, thereby forming impurity regions 27. Thereafter, an inter layer dielectric (ILD) layer 28 and a fifth photoresist film (not shown) are successively formed on the impurity regions 27 including the gate electrode 26 and the field oxide layers 21. Next, the fifth photoresist film is selectively removed over the impurity regions 27, with exposure and development processes. With the fifth photoresist pattern serving as a mask, the ILD layer 28 is selectively etched. Then, the fifth photoresist film is removed. Subsequently, a conductive layer 29 and a sixth photoresist film (not shown) are formed on the ILD layer 28 including the impurity regions 27. Exposure and development processes are applied to the photoresist film so that it is removed over the gate electrode 26. With the sixth photoresist pattern serving as a mask, the conductive layer 29 is selectively etched. Then, the remaining sixth photoresist film is removed, thereby completing a conventional CMOS. At this time, a PMOS and an NMOS are formed on the n-type well 15 and the p-type well 17, respectively.

Figure 3:
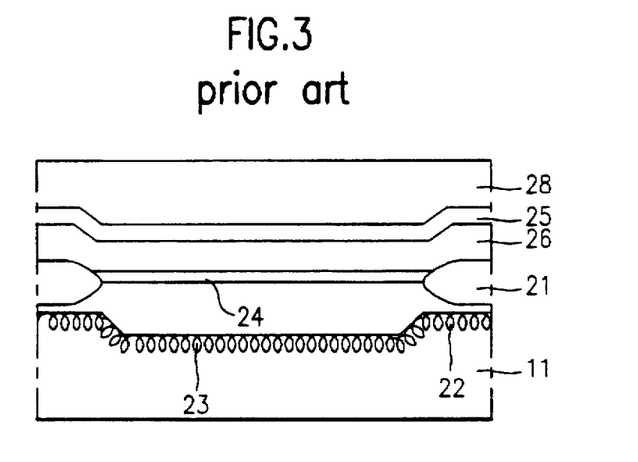
FIG. 3 is a layout of the general transistor with regard to an NMOS and a PMOS, taken along line I–I' of FIG. 1.

FIG. 3 is a cross-sectional view showing the structure of the transistor with regard to NMOS and PMOS, taken along line I–I' of FIG. 1.

As shown in FIG. 3, a transistor includes a field stop region 22 and a punch-through stop region 23 formed at the same time, in a semiconductor substrate 11. A field oxide layer 21 is formed over the field stop region 22, and a gate oxide layer 24 is formed over the punch-through stop region 23. A gate electrode 26 is formed on the gate oxide layer 24 including the field oxide layer 21, and a gate cap oxide layer 25 and an ILD layer 28 are successively formed on the gate electrode 26. At this time, the gate electrode 26 has a step coverage.

The conventional method for manufacturing a CMOS has the following problems. Generally, the thicker a pad oxide layer of a PMOS, the smaller the fluctuation of its threshold voltage. The thinner a pad oxide layer of an NMOS, the smaller the fluctuation of its threshold voltage. Since the pad oxide layer of the PMOS has the same thickness as that of the pad oxide layer of the NMOS, good narrow width effects can not be achieved at both the PMOS and the NMOS.

SUMMERY OF THE INVENTION

Accordingly, the present invention is directed to a method for manufacturing a semiconductor device that substantially obviates one or more of problems due to limitations and disadvantages of the related art.

An object of the invention is to provide a method for manufacturing a semiconductor device in which a pad oxide layer is differentiated in thickness at an NMOS and a PMOS, thereby achieving narrow width effects at both the PMOS and the NMOS.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for manufacturing a semiconductor device includes the steps of: forming an n-type well a p-type well under a surface of a semiconductor substrate; forming a pad oxide layer, so as to be thicker on the p-type well than on the n-type well; and forming between the n-type and p-type wells a field oxide layer having less bird's beak over the n-type well than over the p-type well.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Referring to FIGS. 4a through 4h, a method for manufacturing a CMOS according to a first embodiment of the invention is now described.

Figure 4A:
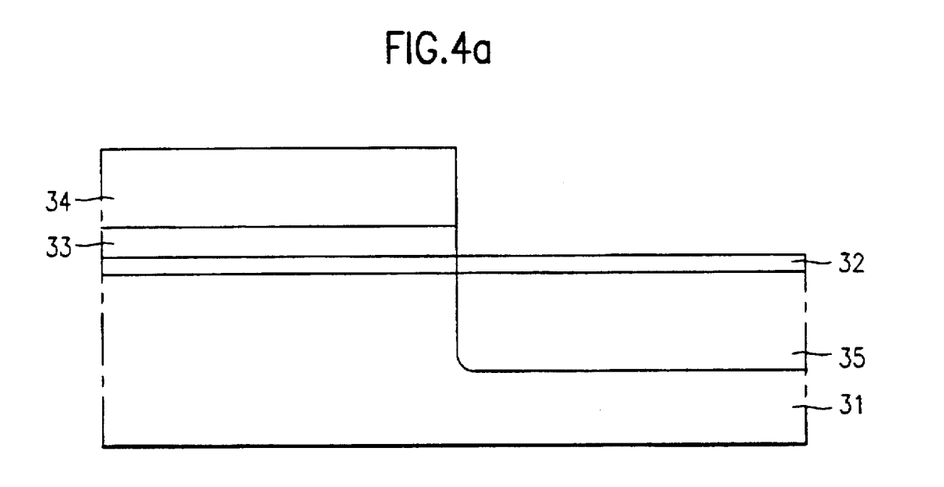
FIGS. 4a–4h are cross-sectional views showing process steps of a method for manufacturing a CMOS according to a first embodiment of the invention.

As shown in FIG. 4a, an early oxide layer 32, a first nitride layer 33, a first photoresist film 34 are successively formed on a p-type semiconductor substrate 31. Subsequently, the first photoresist film 34 is subjected to exposure and development to be removed over a portion of the substrate 31 where an n-type well is to be formed. With the photoresist pattern 34 serving as a mask, the first nitride layer 33 is selectively removed. Then, n-type impurity ions are implanted and diffused with drive-in, thereby forming an n-type well 35 under a surface of the p-type semiconductor substrate 31.

Figure 4B:
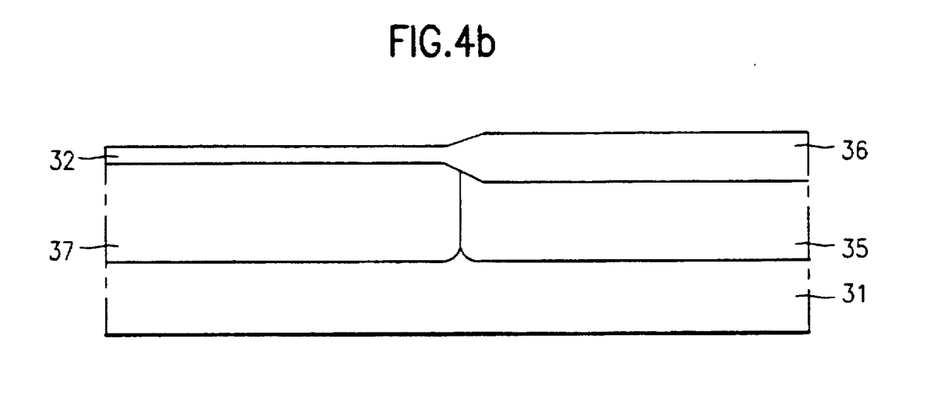

Referring to FIG. 4b, the early oxide layer 32 over the n-type well 35 and the first photoresist film 34 are removed. Next, with the first nitride layer 33 serving as a mask, a first oxide layer 36 is grown through a thermal oxidation process on the surface of the semiconductor substrate 31. Then, the first nitride layer 33 is removed. Thereafter, with the first oxide layer 36 serving as a mask, p-type impurity ions are implanted and diffused with drive-in, thereby forming a p-type well 37 next to the n-type well 35 under the surface of the semiconductor substrate 31.

Figure 4C:
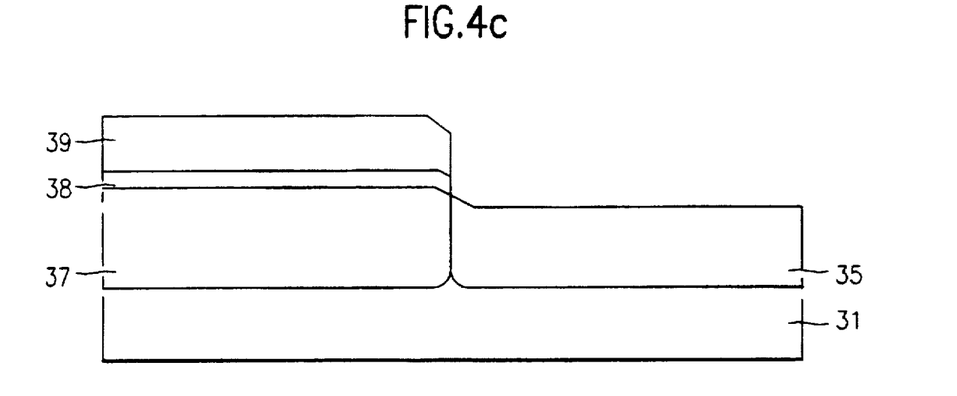

Referring to FIG. 4c, the early oxide layer 32 and the first oxide layer 36 are removed, and then a first pad oxide layer 38 and a second photoresist film 39 are successively formed on the entire surface. With exposure and development processes, the second photoresist film 39 is patterned to be removed from the top of the n-type well 35. With the second photoresist pattern 39 serving as a mask, the first pad oxide layer 38 is selectively etched. Next, the remaining second photoresist film 39 is removed.

Figure 4D:
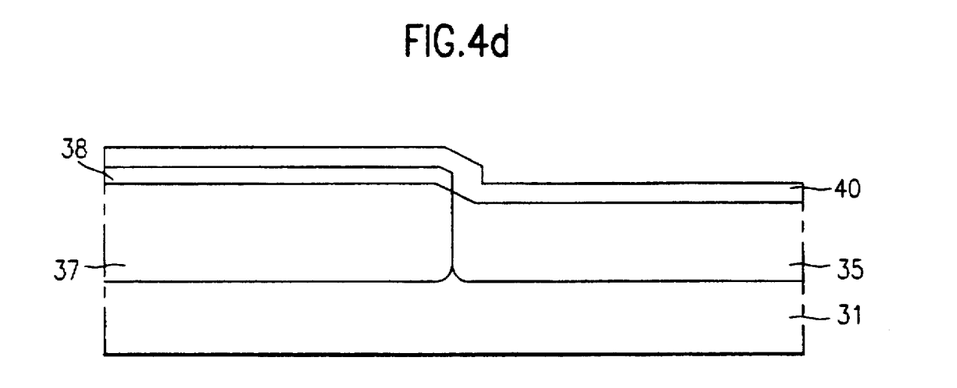

Referring to FIG. 4d, a second pad oxide layer 40 is grown on the entire surface of the semiconductor substrate 31 including the first pad oxide layer 38. As a result, the whole pad oxide layer is thicker on the p-type well 37 than on the n-type well 35.

Figure 4E:
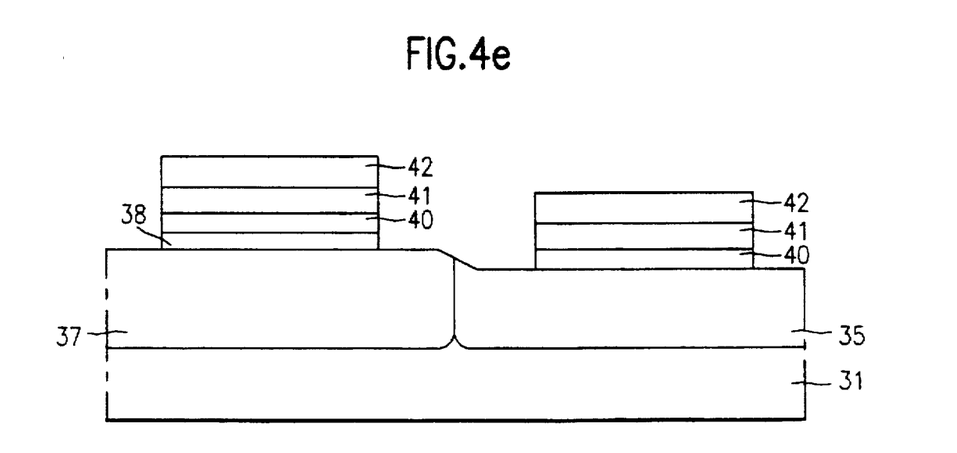

Referring to FIG. 4e, a second nitride layer 41 and a third photoresist film 42 are successively formed on the second pad oxide layer 40. Next, the third photoresist film 42 is selectively patterned with exposure and development to be removed over a device isolation region. With the third photoresist pattern 42 serving as a mask, the second nitride layer 41 and first and second pad oxide layers 38 and 40 are selectively etched.

Figure 4F:
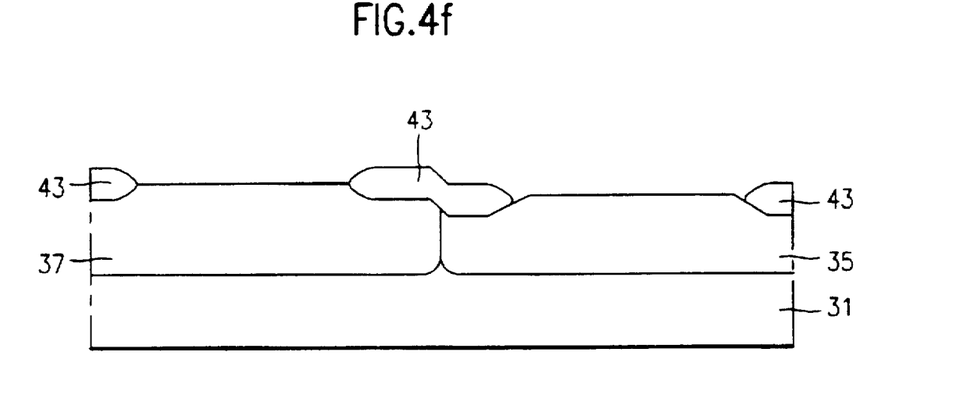

Referring to FIG. 4f, the third photoresist film 42 is removed. With the second nitride layer 41 serving as a mask, field ions are implanted and a field oxide layer 43 is grown on the surface of the semiconductor substrate 31. Subsequently, the second nitride layer 41 and the first and second pad oxide layers 38 and 40 are removed. At this time, since the whole pad oxide layer has partially different thicknesses, the portion of bird's beak of the field oxide layer 43 on the n-type well 35 is removed with the first and second pad oxide layers, whereby the bird's beak of the field oxide layer 43 is smaller on the n-type well 35 than on the p-type well 37.

Figure 4G:
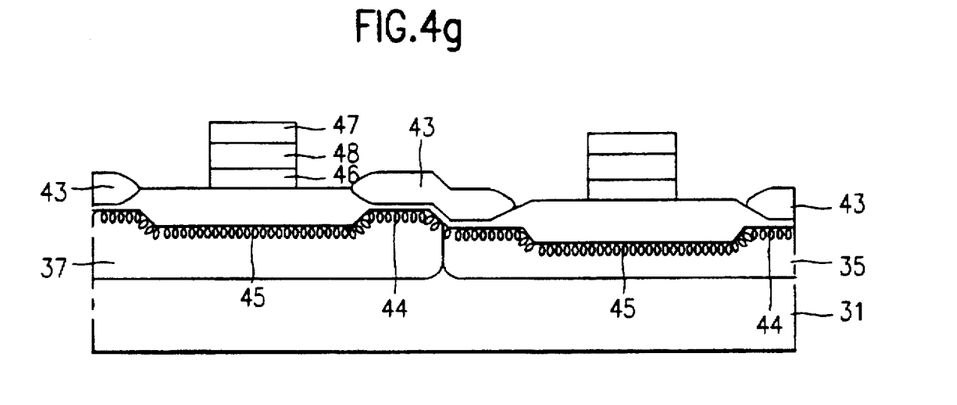

Referring to FIG. 4g, by using a photo etching process, n-type impurity ions are implanted into the n-type well 35, and p-type impurity ions are implanted into the p-type well 37, thereby forming a field stop region 44 and a punch-through stop region 45 at the same time. A gate oxide layer, a polysilicon layer, and a gate cap oxide layer are successively formed on the p-type well 37 including the field oxide layer 43 and the n-type well 35, and then are selectively etched to form a gate oxide layer 46, a gate cap oxide layer 47, and a gate electrode 48 on the active region between the field oxide layers 43.

Figure 4H:
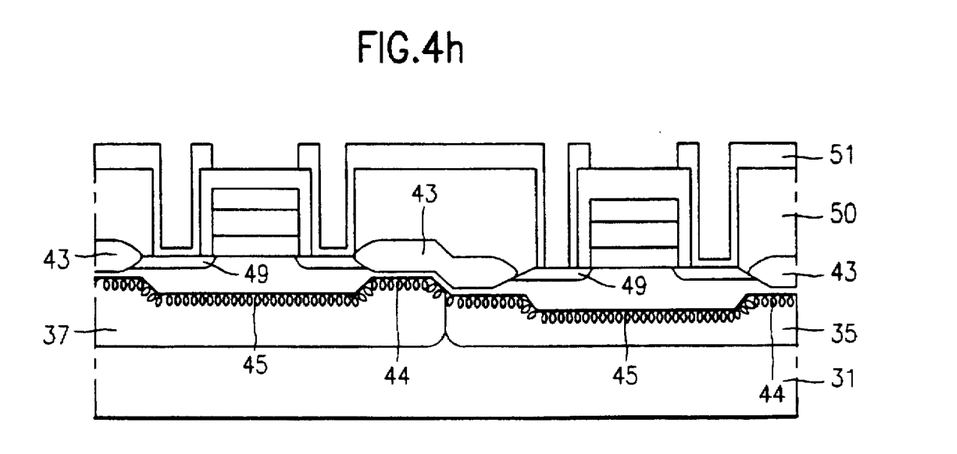

Referring to FIG. 4h, with the gate electrode 48 serving as a mask, p-type impurity ions are implanted into the n-type well 35, and n-type impurity ions are implanted into the p-type well 37, thereby forming impurity regions 49. Subsequently, an ILD layer 50 and a fourth photoresist film (not shown) are successively formed on the impurity regions 49 including the gate electrode 48 and the field oxide layer 43. Thereafter, the fourth photoresist film is patterned with exposure and development to be removed from the top of the impurity regions. With the fourth photoresist pattern serving as a mask, the ILD layer 50 is selectively etched. Then, the remaining fourth photoresist film is removed. Next, a conductive layer 51 and a fifth photoresist film (not shown) are successively formed on the surface of the ILD layer 50 including the impurity regions 49. Then, the fifth photoresist film is selectively patterned with exposure and development, to be removed from the top of the gate electrodes 48. With the fifth photoresist pattern serving as a mask, the conductive layer 51 is selectively etched. Then, the remaining fifth photoresist film is removed.

Figure 5A:
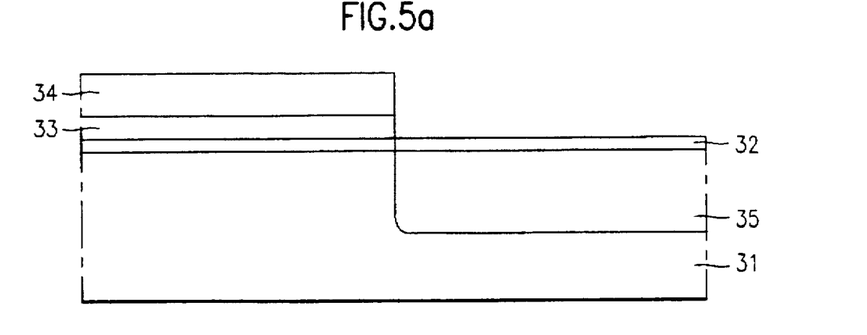
FIGS. 5a–5g are cross-sectional views showing process steps of a method for manufacturing a CMOS according to a second embodiment of the invention.

FIGS. 5a through 5g are cross-sectional views showing process steps of a method for manufacturing a CMOS according to a second embodiment of the invention. Referring initially to FIG. 5a, an early oxide layer 32, a first nitride layer 33, and a first photoresist film 34 are successively formed on a p-type semiconductor substrate 31. Next, the first photoresist film 34 is selectively patterned with exposure and development to be removed over a portion of the substrate 31 where an n-type well is to be formed. With the first photoresist pattern 34 serving as a mask, the first nitride layer 33 is selectively removed and n-type impurity ions are implanted and diffused with drive-in, thereby forming an n-type well 35 under a surface of the semiconductor substrate 31.

Figure 5B:
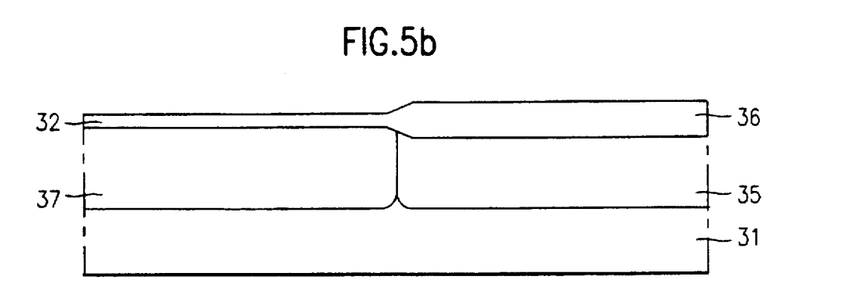

Referring to FIG. 5b, the early oxide layer 32 on the n-type well 35 and the remaining first photoresist film 34 are removed. With the first nitride layer 33 serving as a mask, a first oxide layer 36 is grown through a thermal oxidation process. The first nitride layer 33 is removed. Next, with the first oxide layer 36 serving as a mask, p-type impurity ions are implanted and diffused with drive-in, thereby forming a p-type well 37 next to the n-type well 35, under the surface of the semiconductor substrate 31.

Figure 5C:
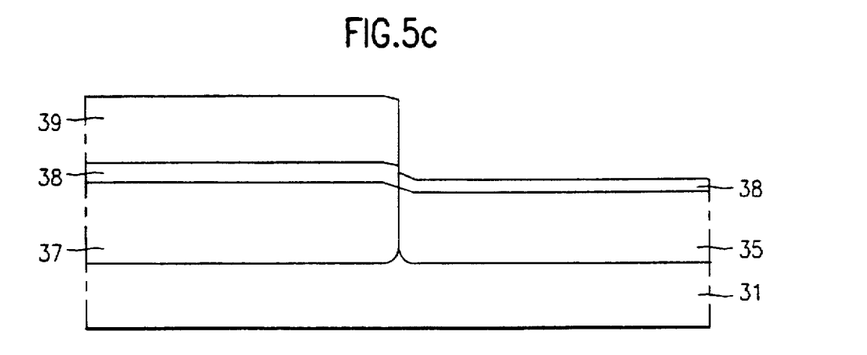

Referring to FIG. 5c, the early oxide layer 32 and the first oxide layer 36 are removed, and then a first pad oxide layer 38 and a second photoresist film 39 are successively formed on the entire surface. Next, the second photoresist film 39 is selectively patterned with exposure and development to be removed from the top of the n-type well 35. With the second photoresist pattern 39 serving as a mask, the first pad oxide layer 38 is selectively etched by a predetermined thickness and then the remaining photoresist film 39 is removed. Accordingly, the pad oxide layer is thicker on the p-type well 37 than on the n-type well 35.

Figure 5D:
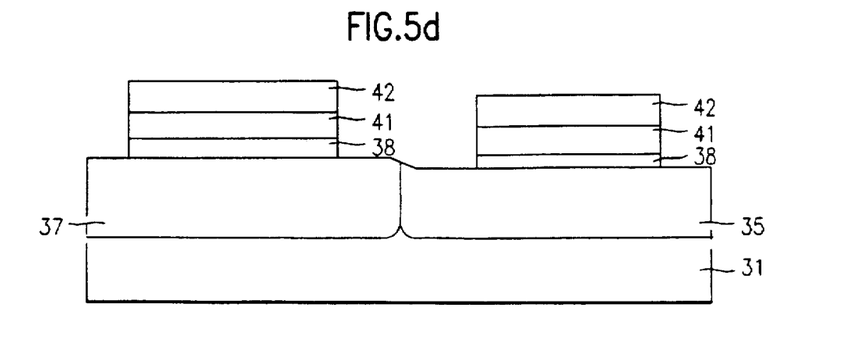

Referring to FIG. 5d, a second nitride layer 41 and a third photoresist film 42 are successively formed on the first pad oxide layer 38. Next, the third photoresist film 42 is patterned with exposure and development to be removed over a device isolation region. With the third photoresist pattern 42 serving as a mask, the second nitride layer 41 and the first oxide layer 38 are selectively etched.

Figure 5E:
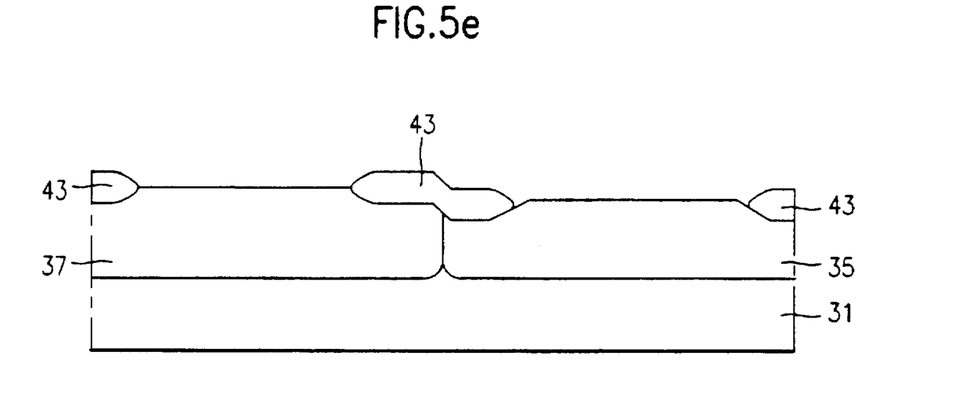

Referring to FIG. 5e, the remaining third photoresist film 42 is removed. With the second nitride layer 41 serving as a mask, field ions are implanted and a field oxide layer 43 is grown. Subsequently, the second nitride layer 41 and the first pad oxide layer 38 are removed. At this time, due to different thicknesses of the whole pad oxide layer, bird's beak of the field oxide layer 43 is smaller on the n-type well 35 than on the p-type well 37.

Figure 5F:
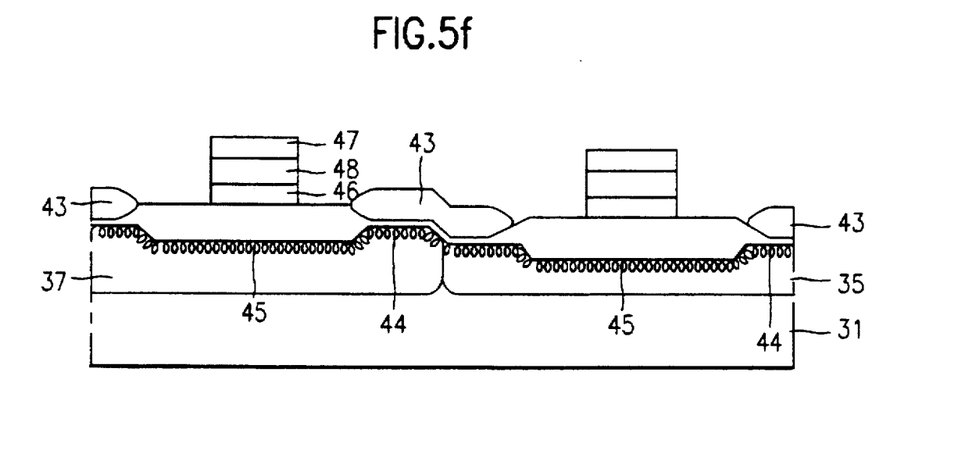

Referring to FIG. 5f, by using a photo etching process over the p-type well 37 including the field oxide layer 43 and the n-type well 35, n-type impurity ions are implanted into the n-type well 35 and p-type impurity ions are implanted into the p-type well 37, thereby forming a field stop region 44 and a punch-through stop region 45. A gate oxide layer, a polysilicon layer, and a gate cap oxide layer are successively formed on the p-type and n-type wells 37 and 35 including the field oxide layer 43, and then are selectively etched to form a stack of gate oxide layer 46, a gate cap oxide layer 47, and a gate electrode 48 on the active region between the field oxide layers 43.

Figure 5G:
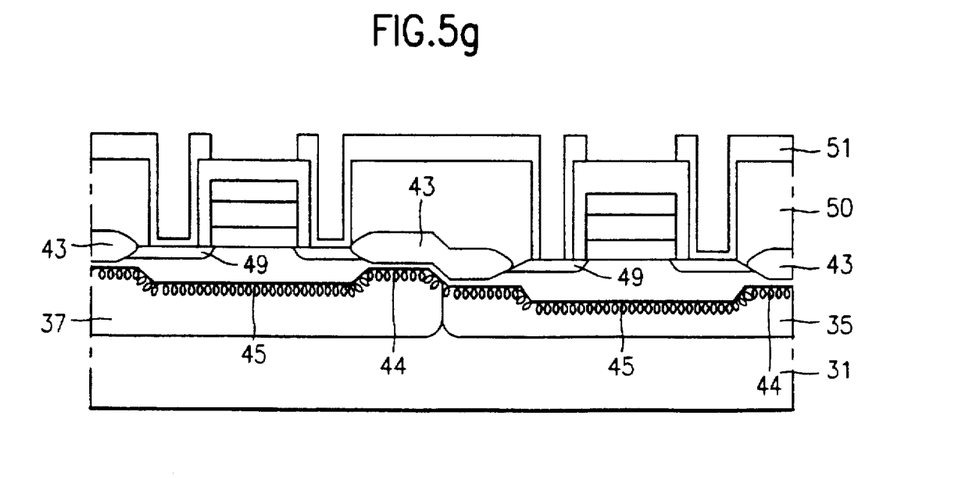

Referring to FIG. 5g, with the gate electrode 48 serving as a mask, p-type impurity ions are implanted into the n-type well 35, and n-type impurity ions into the p-type well 37, thus forming impurity regions 49. Next, an ILD layer 50 and a fourth photoresist film (not shown) are successively formed on the impurity regions 49 including the gate electrode 48 and the field oxide layer 43. Subsequently, the fourth photoresist film is patterned with exposure and development so that it is removed from the impurity regions 49. With the fourth photoresist pattern serving as a mask, the ILD layer 50 is selectively etched. Then the remaining fourth photoresist film is removed. Thereafter, a conductive layer 51 and a fifth photoresist film (not shown) are successively formed on the ILD layer 50 including the impurity regions 49. Then, the fifth photoresist film is patterned with exposure and development so that it is removed from the gate electrode 48. With the fifth photoresist pattern serving as a mask, the conductive layer 51 is selectively etched. Then the remaining fifth photoresist film is removed.

Figure 6:
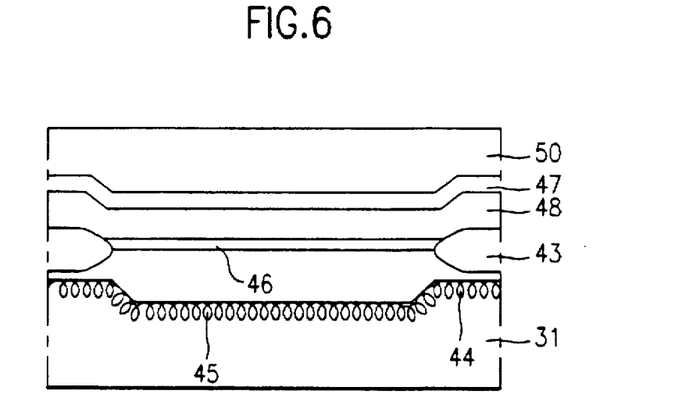
FIG. 6 is a cross-sectional view showing the structure of a CMOS with regard to a PMOS according to the invention, taken along line I–I' of FIG. 1.
Figure 7:
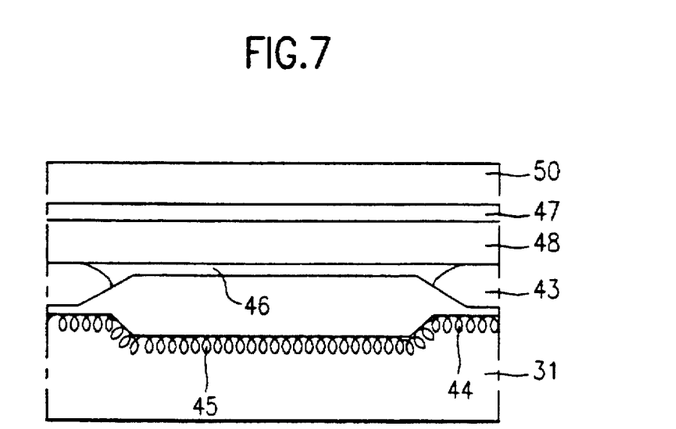
FIG. 7 is a cross-sectional view showing the structure of the CMOS with regard to an NMOS according to the invention, taken along line I–I' of FIG. 1.

FIG. 6 is a cross-sectional view with regard to a PMOS, taken along line I–I' of FIG. 1, and FIG. 7 is a cross-sectional view with regard to an NMOS, taken along line I–I' of FIG. 1.

As shown in FIGS. 6 and 7, each of the PMOS and NMOS includes a field oxide layer 43 formed on a field region of a semiconductor substrate 31 where active regions and field regions are defined. A field stop region 44 is formed under the field oxide layer 43, and a punch-through stop region 45 is formed in the active region. A gate oxide layer 46, a gate electrode 48, and a gate cap oxide layer 47 are successively formed on the active region of the semiconductor substrate 31. An ILD layer 50 is formed on the gate cap oxide layer 47. However, there is difference between the PMOS and the NMOS. As shown in FIG. 6, the active region is formed to be planar in the PMOS. In an interface of the active region and the field oxide layer 43, the active region shown in FIG. 7 is formed to be at a lower position for the NMOS.

The present invention has the following advantages. A pad oxide layer is formed to have different thicknesses on active regions of NMOS and PMOS. In addition, a field oxide layer is formed with a thermal oxidation process. As a result, narrow width effects at both the PMOS and the NMOS are improved.

It will be apparent to those skilled in the art that various modification and variations can be made in the method for manufacturing a semiconductor device of the present invention without departing from the spirit or scope of the inventions. Thus, it is intended that the present invention cover the modifications and variations of this invention provided they come within the scope of the appended claims and their equivalents.

What is claimed is:

1. A method for manufacturing a semiconductor device, the method comprising the steps of:

forming an n-type well and a p-type well under a surface of a semiconductor substrate;

forming a pad oxide layer having a first thickness on the p-type well and a second thickness on the n-type well, the first thickness being greater than the second thickness; and forming a field oxide layer between the n-type well and the p-type well, the field oxide layer having less bird's beak on the n-type well than on the p-type well.

2. The method as claimed in claim 1, wherein the step of forming a pad oxide layer includes the steps of:

forming a first pad oxide layer above the p-type well; and forming a second pad oxide layer above the p-type well and the n-type well.

3. The method as claimed in claim 1, wherein the step of forming a pad oxide layer includes the steps of:

forming a pad oxide layer on the semiconductor substrate; and etching the pad oxide layer above the n-type well by a predetermined thickness.

4. A method for manufacturing a semiconductor device, the method comprising the steps of:

forming an n-type well under a surface of a selected portion of a substrate;

forming an oxide layer on the surface of the substrate above the n-type well;

forming a p-type well under the surface of the substrate using the oxide layer as a mask;

removing the oxide layer;

forming a first pad oxide layer on the p-type well;

forming a second pad oxide layer on the first pad oxide layer and the n-type well;

selectively removing the first and second pad oxide layers on an isolation region between the p-type and n-type wells;

thereafter forming an isolation oxide layer on the isolation region; and removing the first and second pad oxide layers.

5. The method as claimed in claim 4, wherein the isolation oxide layer has less bird's beak on the n-type well than on the p-type well.

6. The method as claimed in claim 4, further comprising the steps of:

forming a gate electrode on each of the p-type well and the n-type well; and forming impurity regions of n conductive type in the p-type well and impurity regions of p conductive type in the n-type well in the substrate at both sides of the gate electrode using the gate electrode as a mask.

7. The method as claimed in claim 6, prior to the step of forming a gate electrode, further comprising the step of implanting ions of opposite conductive types to each of the p-type well and the n-type well, respectively, into the substrate, thereby forming a channel stop region and a punch-through stop region.

8. The method as claimed in claim 6, after the step of forming impurity regions, further comprising the steps of:

forming an insulating layer on the gate electrode, the p-type well and the n-type well, the insulating layer having a contact hole on each of the impurity regions; and forming a conductive layer contacting the impurity region through the contact hole.

9. The method as claimed in claim 8, wherein the insulating layer includes an interlayer dielectric layer.

10. A method for manufacturing a semiconductor device, the method comprising the steps of:

forming an n-type well under a surface of a selected portion of a substrate;

forming an oxide layer on the surface of the substrate above the n-type well;

forming a p-type well under the surface of the substrate using the oxide layer as a mask;

removing the oxide layer;

forming a pad oxide layer on the p-type well and the n-type well;

removing the pad oxide layer on the n-type well by a predetermined thickness;

selectively removing the pad oxide layer on an isolation region between the p-type and n-type wells;

forming an isolation oxide layer on the isolation region; and removing the remaining pad oxide layer.

11. The method as claimed in claim 10, wherein the isolation oxide layer has less bird's beak on the n-type well than on the p-type well.

12. The method as claimed in claim 10, further comprising the steps of:

forming a gate electrode on each of the p-type well and the n-type well; and forming impurity regions of n conductive type in the p-type well and impurity regions of p conductive type in the n-type well at both sides of the gate electrode using the gate electrode as a mask.

13. The method as claimed in claim 12, prior to the step of forming a gate electrode, further comprising the step of implanting ions of opposite conductive types to each of the p-type well and the n-type well, respectively, into the substrate, thereby forming a channel stop region and a punch through stop region.

14. The method as claimed in claim 12, after the step of forming impurity regions, further comprising the steps of:

forming an insulating layer on the gate electrode, the p-type well and the n-type well, the insulating layer having a contact hole on each of the impurity regions; and forming a conductive layer contacting the impurity region through the contact hole.

15. The method as claimed in claim 14, wherein the insulating layer includes an interlayer dielectric layer.

16. The method as claimed in claim 4, wherein the oxide layer is formed by a thermal oxidation.

17. The method as claimed in claim 10, wherein the oxide layer is formed by a thermal oxidation.

* * * * *